United States Patent [19]
Nishimura et al.

[11] Patent Number: 5,239,410
[45] Date of Patent: Aug. 24, 1993

[54] METHOD AND APPARATUS FOR LIGHT AMPLIFICATION EXHIBITING A FLAT GAIN SPECTRUM

[75] Inventors: Michiyo Nishimura, Fujisawa; Yuichi Handa, Atsugi, both of Japan

[73] Assignee: Canon Kabushiki Kaisha, Tokyo, Japan

[21] Appl. No.: 679,109

[22] Filed: Apr. 2, 1991

[30] Foreign Application Priority Data

Apr. 3, 1990 [JP] Japan .................. 2-88917

[51] Int. Cl.⁵ .............................. H01S 3/19
[52] U.S. Cl. .............................. 359/344
[58] Field of Search .............. 359/344; 372/45, 49, 372/50

[56] References Cited

U.S. PATENT DOCUMENTS

| | | | |
|---|---|---|---|
| 4,680,769 | 7/1987 | Miller | 372/50 |
| 4,747,650 | 5/1988 | Sakuda | 350/96.14 |
| 4,904,045 | 2/1990 | Alferness et al. | 350/96.19 |
| 4,942,366 | 7/1990 | Toda | 359/344 |
| 5,019,787 | 5/1991 | Carlson et al. | 359/344 |

FOREIGN PATENT DOCUMENTS 1-179488  7/1989  Japan .
1-186695  7/1989  Japan .

*Primary Examiner*—Mark Hellner
*Attorney, Agent, or Firm*—Fitzpatrick, Cella, Harper & Scinto

[57] ABSTRACT

A semiconductor light amplifier comprises a substrate, a semiconductor activation layer formed on the substrate for propagating light, and amplifying light propagated through the activation layer which has a wavelength within a predetermined range when a current is applied thereto, an electrode for applying a current to at least a portion of the activation layer, and means for imparting a loss to the light propagated through the activation layer which has a wavelength in a portion of the predetermined wavelength range.

48 Claims, 8 Drawing Sheets

METHOD AND APPARATUS FOR LIGHT AMPLIFICATION EXHIBITING A FLAT GAIN SPECTRUM

BACKGROUND OF THE INVENTION

1. Field of the Invention

The present invention relates to a semiconductor light amplifier used in a light communication system, and a method for light amplification by the light amplifier.

2. Related Background Art

In general, a semiconductor light amplifier refers to one which has a semiconductor laser structure and amplifies an external input light with a biasing current lower than a threshold. In the field of light communication, methods have been developed to compensate for light loss which occurs in the connection in a fiber or between fibers. Further, since the semiconductor light amplifier has a gain over a wide wavelength range and can simultaneously amplify light having different wavelengths, it is expected for use in simultaneous amplification of multi-wavelength signals.

Where the semiconductor light amplifier is used for the simultaneous amplification of the multi-wavelength signals, it is desirable to impart the same gain to various input light. However, it is known in the prior art semiconductor light amplifier that the gains are different from wavelength to wavelength. Such differences in the gains are harmful in constructing a multi-wavelength communication system.

For example, after a signal light has passed through the semiconductor light amplifier, the output light levels of the signals of different wavelengths are different and hence an additional requirement such as broadening the dynamic range of a light receiver is imposed.

On the other hand, based on the restriction imposed to the light receiver, the wavelengths of the signal lights, the wavelength multiplexity and the wavelength range are determined. This is disadvantageous in designing the system.

The wavelength dependency of the gain, that is, the gain spectrum is mainly due to a laser structure. Accordingly, the gain spectrum is designed by designing an activation layer of the semiconductor laser structure.

As a method for overcoming the above problems and improving the gain spectrum, Japanese Laid-Open Patent Application No. 1-179488 discloses a method of imparting a quantum well structure having different quantum wells to a light amplifier. On the other hand, U.S. Pat. No. 4,680,769 discloses a method for constructing a laser structure by connecting two serially arranged activation layers. In those methods, the gains are superimposed on the spectrum to design a gain spectrum in a desired wavelength range, particularly in a wide wavelength range.

However, in those methods, the design is relatively complex because the activation layer itself is a parameter to determine the gain spectrum. For example, in the method disclosed in Japanese Laid-Open Patent Application No. 1-179488, a desired result is not readily attained unless the design is made with the consideration of a current injection condition.

In the method disclosed in U.S. Pat. No. 4,680,769, it is difficult to connect the two activation layers and it is necessary to pay full attention to an optical alignment.

Those methods may be effective when the semiconductor light amplifier is designed for a wide wavelength range of several tens to several hundreds nm, but since only one activation layer may have a broad gain spectrum distribution, it is not always wise to try to attain the equal effect in a relatively narrow wavelength range. In such a case, the superposition of the gain spectra described above may cause the degradation of other properties such as increase of noise.

SUMMARY OF THE INVENTION

It is an object of the present invention #to solve the problems encountered in the prior art and provide a light amplifier which has a simple construction and attains a flat gain spectrum without increasing noise, and a method for light amplification by using the light amplifier.

The above object of the present invention is achieved by a semiconductor light amplifier comprising:

a substrate;

a semiconductor activation layer formed on said substrate for propagating light;

said activation layer amplifying light propagated through said activation layer and having a wavelength in a predetermined range when a current is applied thereto;

an electrode for supplying the current to at least a portion of said activation layer; and means for imparting a loss to the light propagated through said activation layer which has a wavelength in a portion of said predetermined wavelength range.

The above object of the present invention is also achieved by a method for amplifying a light by using the above light amplifier, comprising the steps of:

applying light to said activation layer;

propagating the input light through said activation layer;

applying a current from said electrode to said activation layer to amplify light propagated through said activation layer which has a wavelength within a predetermined range;

imparting a loss by said means for imparting the loss to the light propagated through said activation layer which has a wavelength in a portion of said predetermined wavelength range; and taking out the amplified light from said activation layer.

In the above amplifier and method, the wavelength range to which the loss is imparted corresponds to a wavelength range having a relatively high gain in the gain spectrum of the activation layer. The means for imparting the loss flattens the gain spectrum of amplification of the light outputted from the activation layer for the light inputted to the activation layer, relative to the gain spectrum of the activation layer.

A semiconductor light amplifier in one embodiment of the present invention comprises:

a substrate;

a semiconductor activation layer formed on said substrate for propagating light in a first propagation mode;

said activation layer amplifying light propagated through said activation layer and having a wavelength within a predetermined range;

an electrode for supplying a current to at least a portion of said activation layer;

a wave guide layer formed on said substrate to be laminated on said activation layer, thicknesswise;

said wave guide layer propagating the light in a second propagation mode different from said first propagation mode; and a diffraction grating formed in an overlapping area of said first propagation mode and said second propagation mode;

said diffraction grating coupling the light propagated through said activation layer which has a wavelength in a portion of said predetermined wavelength range, to said wave guide layer;

the light coupled to said wave guide layer being separated from the light amplified by said activation layer.

In the present invention, an optical filter region or wavelength selective loss means for losing light by separating or absorbing light of a specific wavelength range or wavelength from a light amplification region having a wave guide structure for amplifying a guided light is provided so that a total gain spectrum between input and output may be designed independently from the light amplification region comprising an activation layer formed on a semiconductor substrate. In this manner, the gain spectrum of the light amplification region is improved for a desired wavelength range or wavelengths to substantially equalize the gain spectrum between input and output.

Specifically, the wavelength-selective loss means may comprise a main wave guide directly connected to the light amplification region, an adjacent sub-wave guide and a grating or directive coupler which wavelength-selectively couples those wave guides, or it may comprise a grating or light absorption region which is directly connected to the light amplification region and formed obliquely.

The light amplification region and the wavelength-selective loss means may be formed at separate positions or overlapped at one position as viewed from the direction of travel of the guided light.

In order to isolate the light wave separated by the sub-wave guide from the input/output terminals, a reflection-free structure such as a large absorption region or an oblique end plane may be formed at the end of the sub-wave guide.

Further, the sub-wave guide may be a channel wave guide or a slab wave guide, it may be laminated at a different position from the main wave guide as viewed from a lamination direction of the laminated layers on a substrate, or it may be aligned in the same lamination plane.

DETAILED DESCRIPTION OF THE PREFERRED EMBODIMENTS

The embodiments of the present invention are now explained in detail with reference to the drawings in which like elements are designated by the like numerals and detailed explanation thereof is omitted.

Figure 1:
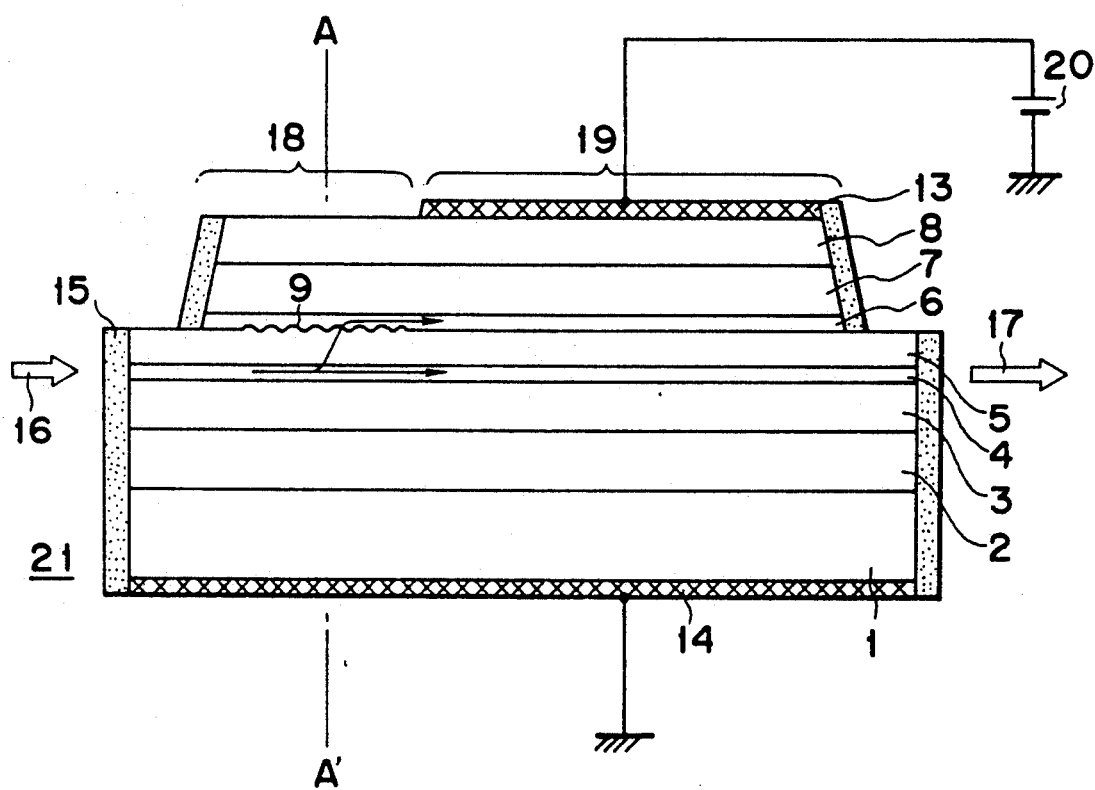
FIG. 1 shows a side sectional view of a first embodiment of a light amplifier of the present invention.
Figure 2:
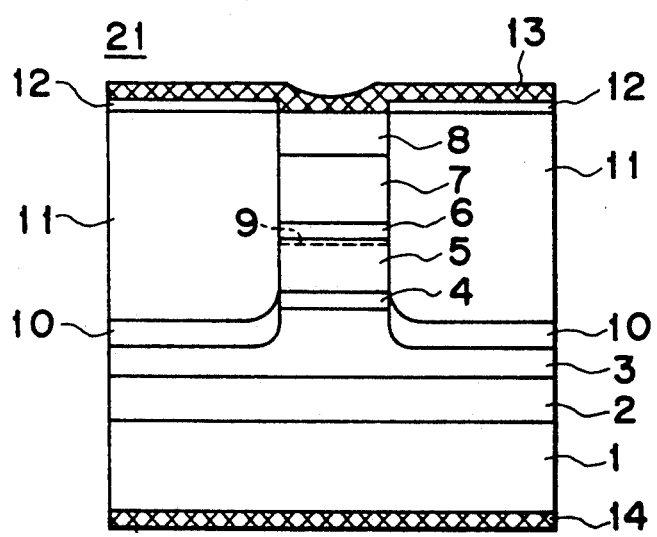
FIG. 2 shows a front sectional view of the semiconductor light amplifier of FIG. 1.

FIG. 1 shows a side sectional view of a first embodiment of the light amplifier of the present invention. The light amplifier comprises a semiconductor light amplifier 21, and a power supply 20. A front sectional view of the light amplifier taken along a line A—A' is shown in FIG. 2.

In the semiconductor light amplifier 21 of FIG. 1, a buffer layer 2, a first clad layer 3, an activation layer 4 of a multi-quantum well (MQW) structure, a second clad layer 5, an optical wave guide layer 6, a third clad layer 7 and a cap layer 8 are sequentially laminated on a substrate 1. The activation layer 4 forms a cavity of a laser resonator by the opposite end planes which are parallel to each other. Anti-reflection (AR) coatings 15 are applied on those end planes. They are provided to prevent the laser resonation from occurring when a current is supplied under a condition of no input light to the activation layer 4. In the light amplifier of the present embodiment, a so-called travelling wave type laser amplifier is formed by providing the AR coatings 15.

The light amplifier 21 is divided into an optical filter region 18 and a light amplification region 19 along a direction of light propagation. A diffraction grating 9 is formed on a boundary surface between the second clad layer 5 and the optical wave guide layer 6 in the optical filter region 18. The diffraction grating 9 couples light which is propagated through the activation layer 4 and has a predetermined wavelength range to the optical wave guide layer 6.

A first electrode 13 is formed on the cap layer 8 in the light amplification region 19. The first electrode 13 is connected to the power supply 20. A second electrode 14 is formed on the bottom surface of the substrate 1. The power supply 20 supplies a current to the activation layer 4 in the light amplification region through those electrodes. The activation layer 4 amplifies the light other than a portion of the light coupled to the optical wave guide layer 6, by the supply of the current.

A portion of the first clad layer, the activation layer 4, the second clad layer 5, the optical wave guide layer 6, the third clad layer 7 and the cap layer 8 are etched to leave a striped mesa extending along a direction of light propagation as shown in FIG. 2. The removed areas are buried by buried layers 10 and 11. An insulation layer 12 is formed on the buried layer 11 so that the current is injected from the electrode 13 only to the mesa.

The semiconductor light amplifier may be manufactured in the following manner. The buffer layer 2 made of n-GaAs and the first clad layer made of n-Al$_{0.5}$Ga$_{0.5}$As and having a thickness of 1.5 μm are formed on the substrate 1 made of n-GaAs, by an organic metal chemical vapor deposition (MO-CVD) method. Then, well layers made of non-doped GaAs and barrier layers made of non-doped Al0.4Ga$_{0.6}$As are alternately and repeatedly laminated by the MC-CVD method to form the activation layer 4 of an MQW structure having a total thickness of 0.45 μm. The second clad layer 5 made of p-Al$_{0.5}$Ga$_{0.5}$As is grown on the activation layer 4 by the MO-CVD method.

Then, the diffraction grating 9 is formed on the surface of the second clad layer 6 in the optical filter region 18 by photolithography. Then, well layers made of p-GaAs and barrier layers made of p-Al$_{0.5}$Ga$_{0.5}$As are alternately and repeatedly laminated on the second clad layer 6 by the MO-CVD method to form the optical wave guide layer 6 of the MQW structure having a total thickness of 0.2 μm. Then, the third clad layer 7 made of p-Al$_{0.5}$Ga$_{0.5}$As having a thickness of 1.5 μm and the cap layer 8 made of p-GaAs having a thickness of 0.2 μm are grown on the optical wave guide layer 6 by the MO-CVD method. In the above process, a molecule beam epitaxial (MBE) method may be used in place of the MC CVD method.

Then, the opposite sides are removed up to the first clad layer 3 by wet etching as shown in FIG. 2, and the buried layer 10 made of n-Al$_{0.5}$Ga$_{0.5}$As and the buried layer 11 made of p-Al$_{0.5}$Ga$_{0.5}$As are grown by a liquid phase epitaxial (LPE) method to form a buried structure.

The insulation layer 12 is formed on the buried layer 11 by a plasma CVD method.

Then, as shown in FIG. 1, the area which functions as a light input/output area is removed up to the vicinity of the optical wave guide layer 6 by wet etching. The first electrode 13 of p-type is formed in the area on the cap layer 8 which functions as the light amplification region 19, and the second electrode 14 of n-type is formed on the rear surface of the substrate 1.

Finally, as shown in FIG. 1, the area which functions as the light input/output area is cleaved and ZrO$_2$ films are vapor-deposited on the end planes thereof to a thickness of λ/4 (λ: wavelength) by electron beam (EB) vapor deposition to form the AR coating films 15.

In this manner, the light amplifier having the optical filter region 18 and the light amplifier region 19 is manufactured.

The operation of the present embodiment will now be explained. incident light 16 is condensed by an end of an optical fiber or a lens and applied to the light amplifier. Since the area up to the optical wave guide 6 has been removed in the light input/output area, the incident light is efficiently coupled to the activation layer 4.

Figure 3:
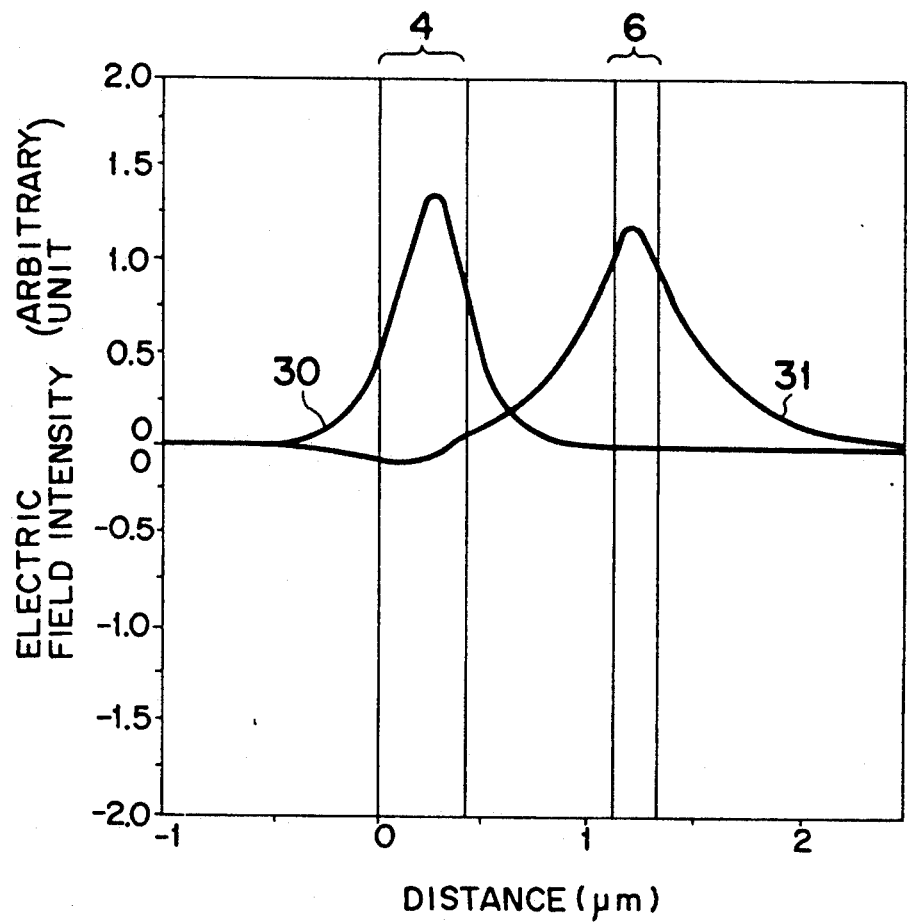
FIG. 3 shows a propagation mode of an activation layer and a wave guide layer in the first embodiment.

In the area where both the activation layer 4 and the wave guide 6 are present, propagation modes shown in FIG. 3 exist. Namely, they include an even mode 30 which is established around the activation layer 4 and an odd mode 31 which is established around the wave guide 6. An ordinate represents an electric field strength and an abscissa represents a distance from the activation layer 4.

The incident light 16 couples to the even mode 30 which has a peak power in the activation layer 4. In the area where there is no diffraction grating 6, the incident light does not substantially couple to the odd mode 31 and it reaches to the other end plane while it is amplified by the activation layer, and produces the output light 17. However, in the area where there is diffraction grating 9, the light power is transferred if the following condition is met between a propagation constant $\beta_o$ of the odd mode and a propagation constant $\beta_e$ of the even mode 30.

$$\beta_e(\lambda) - \beta_o(\lambda) = 2\pi/\Lambda \tag{1}$$

where Λ is a pitch of the diffraction grating 9.

The efficiency of the transferred light depends on the length L of the diffraction grating 9, and it is represented by $$\eta = \sin^2\{((|K|^2+\Delta^2)^{\frac{1}{2}}L\}/(1+\Delta^2/|K|^2) \tag{2}$$

where $K = \int E_e A_1(x) E_o dx$ $\Delta = \beta_e(\lambda) - \beta_o(\lambda) + 2\pi/\Lambda$ $E_e$ and $E_o$ are electric field distributions in the even mode 30 and the odd mode 31, $A_1(x)$ is a component of Fourier progression development which corresponds to a primary diffracted light.

Accordingly, the efficiency is maximum when a complete coupling length $L_c$ is $\pi/2K$, and when $L < \pi/2K$, a portion of the input light can be transferred from the activation layer 4 to the wave guide layer 6. The light transferred to the wave guide layer 6 is guided to the output end without amplification and outputted from the output end. Since this non-amplified light has a different exit direction from that of the output light 17 from the activation layer 4, they can be separately handled.

Thus, in order to attain the light amplifier which has uniform gain with respect to the wavelength, that is, which has a flat gain spectrum, the light at the peak wavelength in the gain distribution of the activation layer region 4 is selectively transferred to the wave guide layer 6 to reduce the total gain of the region.

Figure 4A:
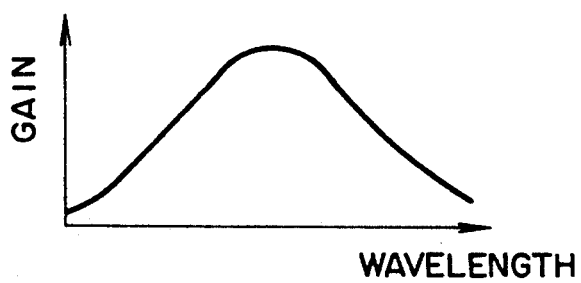
FIG. 4A shows a gain spectrum of the activation layer in the first embodiment.
Figure 4B:
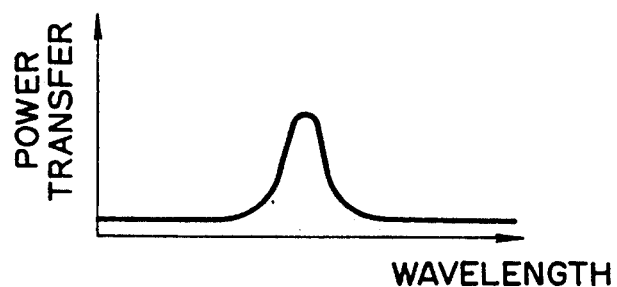
FIG. 4B shows a wavelength dependency of a power transfer of light from the activation layer to the wave guide layer by a diffraction grating in the first embodiment.
Figure 4C:
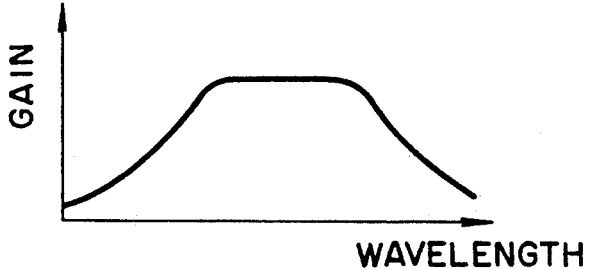
FIG. 4C shows a gain spectrum of amplification of output light to input light in the first embodiment.

FIG. 4A shows a gain spectrum of the activation layer of the first embodiment, that is, a gain spectrum of amplification of the output light relative to the input light when no diffraction grating 9 is provided, FIG. 4B shows wavelength dependency of power transfer of the light from the activation layer 4 to the wave guide layer 6 by the diffraction grating 9 in the first embodiment, and FIG. 4C shows a gain spectrum of amplification of the output light relative to the input light in the first embodiment.

In order to attain the gain spectrum as shown in FIG. 4C, it is necessary to properly design the diffraction grating 9 in accordance with the gain spectrum of the activation layer 4 and the propagation constants of the activation layer 4 and the optical wave guide layer 6. The pitch Λ of the diffraction grating 9 is determined by the formula (1) to cope with the peak wavelength of the gain spectrum. The length L of the diffraction grating 9 is an important parameter to determine the gain distribution. When L is small, the flattening effect shown in FIG. 4C is small, and when L approaches the complete coupling length $L_c$, a dip of the gain takes place in the vicinity of the center wavelength of the diffraction grating 9. A desired flat gain is attained by properly selecting the length L.

In this manner, by properly designing the activation layer 4 and the diffraction grating 9, a good multi-wavelength transmission system having a wavelength range of a flat gain can be constructed. Thus, the gains for the respective signals are substantially uniform, the design of the receiver is simplified, and the system can be constructed without paying much attention to the number of stages and the wavelength multiplexity when the light amplifiers are used in multiple stages.

The construction of the present invention is particularly adapted to a travelling wave type light amplifier having a low end plane reflectivity, and a high gain characteristic which is a feature of the travelling wave type can be effectively utilized.

In the present embodiment, no electrode is provided in the optical filter region 18 which is completely isolated from the light amplifier region 19. The above is equally applicable where the optical filter region 18 has an amplification function. It is rather preferable in that a difference between indices of refraction by the current injection in the optical filter region 18 and the light amplification region 19 is eliminated.

In the first embodiment, the activation layer and the optical wave guide layer are of the MQW structure although they may be of other structure such as single quantum well (SQW) structure or bulk structure.

Further, while one wave guide layer and one diffraction grating are used, a plurality of wave guide layers and diffraction gratings may be serially arranged along a direction of layers, in-plane or light travel. The design may be made to cope with the gain spectrum of the light amplification region 19. For example, where the gain spectrum is asymmetric, two diffraction gratings may be used with the center frequencies thereof set toward a shorter wavelength and a longer wavelength from the peak wavelength of the gain distribution, respectively, so that both affect the gain at the peak wavelength of the gain. In this manner, a flat gain spectrum is attained as it is in the first embodiment.

In essence, the structures and numbers of the diffraction gratings and the wave guide layers are properly designed in accordance with the gain spectrum of the light amplification region so that the gain spectra of the input/output light are equalized in the desired wavelength range or at a plurality of wavelengths.

Figure 5:
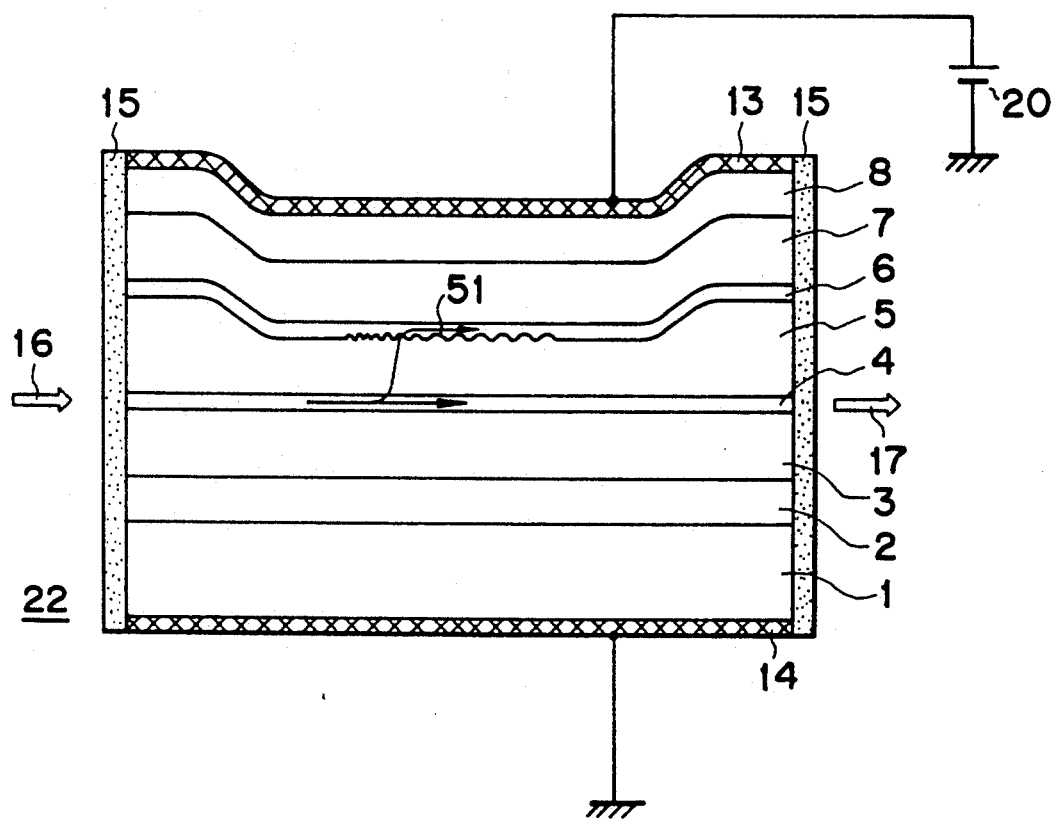
FIG. 5 shows a side sectional view of a second embodiment of the light amplifier of the present invention.

FIG. 5 shows a side sectional view of a second embodiment of the light amplifier of the present invention. In the second embodiment, steps are provided in the vicinity of the input/output end planes from the region in which a diffraction grating 51 is formed, along the direction of lamination, and the diffraction grating is of chirp shape. Other features are identical to those of the first embodiment.

By providing the steps between the input and the output, the coupling of the input light 16 to the optical wave guide layer 6 is prevented in the input area so that the light is effectively coupled to the activation layer 4. In the output area, the light transferred to the wave guide layer 6 is lost more than it is in the first embodiment by the curvature of the optical wave guide layer 6. Further, since the light propagated through the optical wave guide layer 6 is farther away spaced the output light from the activation layer 4 at the exit end, it can be completely separated from the amplified output light 17.

Further, since the diffraction grating 51 is of chirp shape, it is effective in designing any desired gain spectrum. In the first embodiment, the wavelength range for flattening is uniquely determined by the area length L of the diffraction grating 9. In the present embodiment, because the diffraction grating 51 is of chirp shape to enable the modulation of the pitch, a parameter to the wavelength may be adjusted so that the gain can be flattened over any wavelength range.

The basic operation is identical to that of the first embodiment.

In the first and second embodiments, the optical filter extends along the direction of lamination and both the diffraction grating and the wave guide are used. In the present invention, however, the optical filter for improving the gain spectrum need not extend along the direction of lamination and the diffraction grating and the optical wave guide need not coexist.

Figure 6:
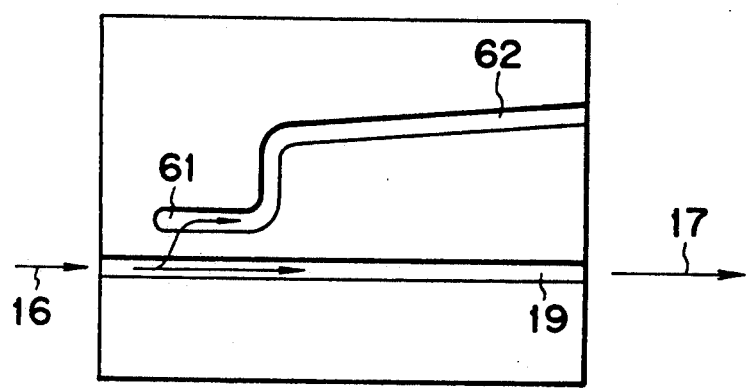
FIG. 6 shows a plan view of a third embodiment of the light amplifier of the present invention.
Figure 7:
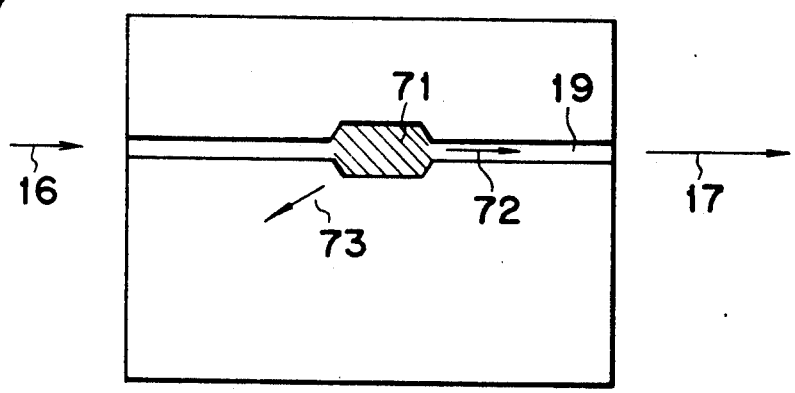
FIG. 7 shows a plan view of a fourth embodiment of the light amplifier of the present invention.

Embodiments in accordance with the above are shown below. FIG. 6 shows a third embodiment and FIG. 7 shows a fourth embodiment.

In the third embodiment, the optical filter uses a directional coupler between channel type optical wave guides arranged not along the direction of lamination but laterally (along the in-plane direction). In the present embodiment, a wavelength characteristic of the directional coupler 61 is utilized and the wave guide structure and the area length are designed as parameters such that a portion of the input light is separated from the light amplification region 19 in order to attain the substantially the same effect as that of the first embodiment.

In the third embodiment, since the coupling is lateral, the activation layer is used as the wave guide layer as it is in the light amplification region 19 as the wave guide structure 62 for the non-amplified light. In this case, the separated non-amplified light is subjected to only the loss by the wave guide 62 including the non-amplifying activation layer.

In the lateral coupling, the wave guide structure 62 for the non-amplified light may be relatively easily changed so that a new effect may be expected. For example, as shown in FIG. 6, the wave guide 62 for the non-amplified light may be deflected or applied obliquely to the end plane so that the return light to the input/output areas can be effectively eliminated. Further, it is effective to implant ions locally into the wave guide 62 so that the non-amplified light is subjected to greater loss while it is guided.

In the fourth embodiment shown in FIG. 7, an oblique grating 71 is formed in a portion of a channel wave guide to impart a filter effect. FIG. 7 shows a lateral (in-plane) sectional view. At the gratings 71, light propagated through the channel wave guide (directly transmitted 0-order light) 72 and slab wave guide light (diffracted light) 73 propagated through the slab wave guide external to the channel are coupled at a Bragg condition. Where a period and an angle of inclination of the grating 71 are selected to meet the Bragg condition for the light wavelength to which a loss is to be imparted as the non-amplified light, the light of the wavelength to which the loss is to be imparted can be coupled from the channel wave guide of the main wave guide to the slab wave guide as the diffracted light 73 to form a wavelength-selective loss area.

In the fourth embodiment, it is effective to implant ions external to the light amplification region 19 to make the light loss greater. The diffraction grating 71 is arranged in the wave guide, but in order to secure the desired wavelength selectivity and diffraction efficiency, the width wave guide may be increased only in the area in which the grating 71 is present.

In the third and fourth embodiments, the method for flattening the gain spectrum is basically identical to that of the first embodiment shown in FIGS. 4A to 4C.

Figure 8:
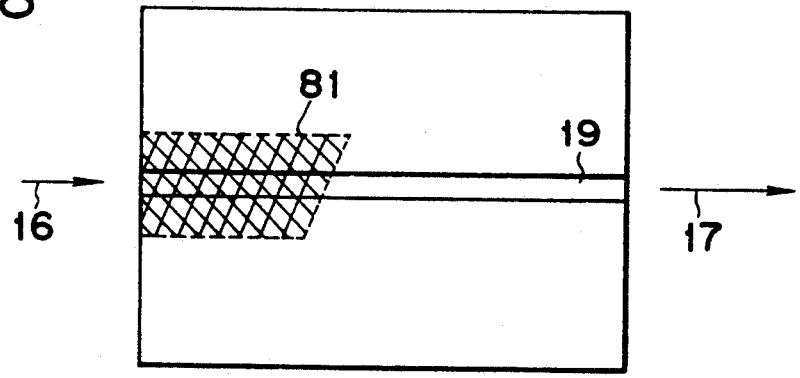
FIG. 8 shows a plan view of a fifth embodiment of the light amplifier of the present invention.

FIG. 8 shows a fifth embodiment. In the fifth embodiment, light absorption is utilized as means for wavelength-selective light loss. Accordingly, a light absorption region 81 is formed in the wave guide and the vicinity thereof. FIG. 8 shows a lateral (in-plane) sectional view.

For example, where material having a light absorption spectrum as shown in FIG. 4B is available, the same effect as those in the above embodiments may be expected. Materials which exhibit such an absorption spectrum include exciter absorption and light chemical hole burning but they have a very narrow wavelength range. They are therefore not appropriate to the present invention which intends to flatten the gain over the range of several nm to several tens nm.

However, it is possible to partially flatten on only one side of the gain distribution by utilizing a normal absorption spectrum (characteristic in the vicinity of the absorption end). Where the light absorption is used, a filter which absorbs light on the shorter wavelength side of a specific wavelength may be used. Thus, the fifth embodiment is somewhat different in its design from the previous embodiments.

Figure 9A:
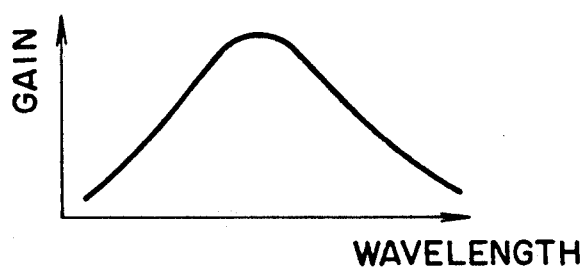
FIG. 9A shows a gain spectrum of a light amplification region in the fifth embodiment.
Figure 9B:
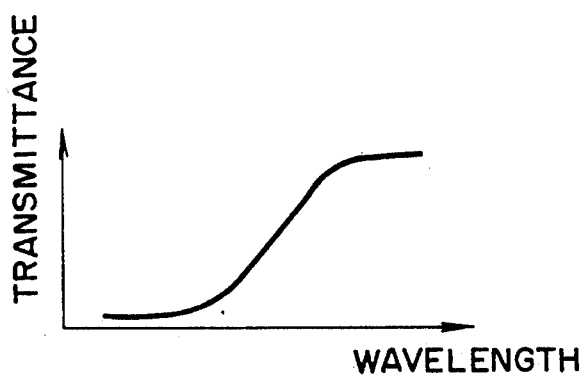
FIG. 9B shows a wavelength dependency of a light transmittance of a light absorption region in the fifth embodiment.
Figure 9C:
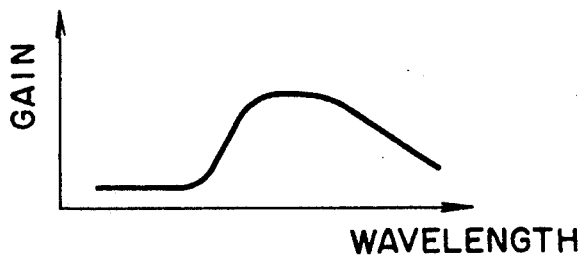
FIG. 9C shows a gain spectrum of amplification of output light to input light in the fifth embodiment; and, FIG. 10 shows a configuration of a light communication system which uses the light amplifier of the present invention.

A design example is shown in FIGS. 9A to 9C.

FIG. 9A shows a gain spectrum of the light amplification region 19 in the fifth embodiment, FIG. 9B shows the wavelength dependency of the light transmittance of the light absorption region 81, and FIG. 9C shows a gain spectrum of amplification of the output light relative to the input light, that is, a total gain spectrum of the light amplifier of the fifth embodiment.

By designing the filter transmittance or the absorption spectrum of the filter such that the optical filter compensates for the gradient on the longer wavelength side from the peak of the gain spectrum of the light amplification region 19, the total gain distribution can be flattened in the wavelength area including the gradient.

In the present embodiment, the gain distribution of the light amplifier is flattened in this manner.

At the boundary between the light absorption region 81 and the light amplification region 19, a refractive index is apt to change and reflection is apt to occur. In order to prevent this, the boundary of both regions is inclined as shown in FIG. 8.

The light absorption region 81 may be formed by using different compositions in the light amplification region 19 and the wave guide. For example, where GaAs is used as the activation layer, $Al_{0.05}Ga_{0.95}As$ may be used as the wave guide layer to provide a desired optical filter.

The compositions may be of appropriate MQW structure.

Figure 10:
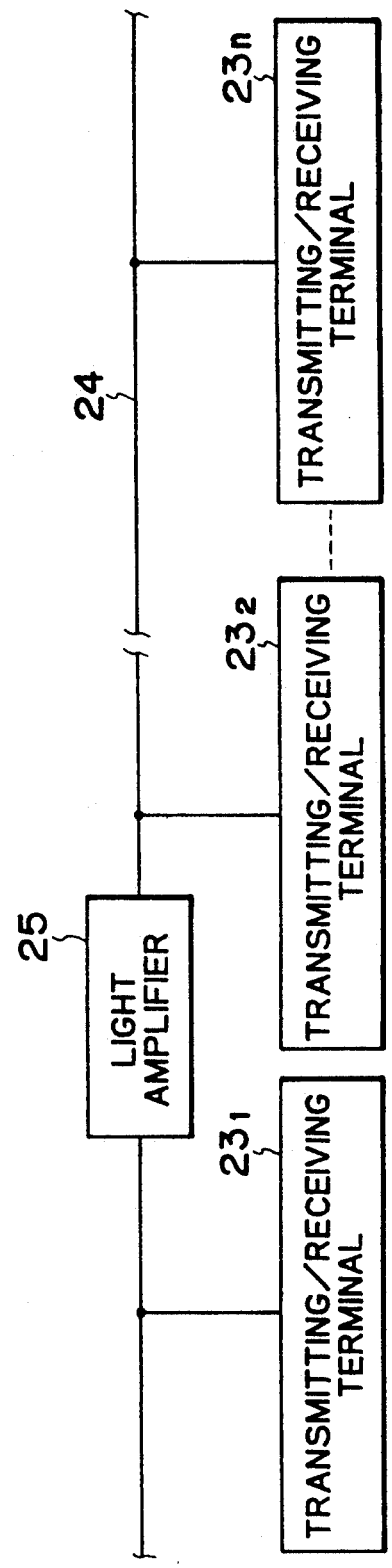

FIG. 10 shows a configuration of a light communication system which uses the light amplifier of the present invention. The light communication system comprises a plurality of transmitting/receiving terminals $23_1, \ldots, 23_{n-1}, 23_n$, a bus line 24 for interconnecting the terminals, and a light amplifier 25 arranged in the path of the bus line 24. Each of the transmitting/receiving terminals includes at least one of a light transmitter and a light receiver to exchange light signals. The light signal emitted from the terminal is transmitted through the bus line 24, which comprises a light transmission medium such as an optical fiber.

The light signal transmitted through the bus line 24 is gradually attenuated by the absorption by the optical fiber. Thus, the light amplifiers 25 are provided in the bus line 24 to amplify the light signal. The semiconductor light amplifier of the present invention is used as the light amplifier 25. Since the light amplifier of the present invention has a flat gain spectrum, it is particularly suitable to the multi-wavelength communication system which communicates by using a plurality of light signals having different wavelengths.

The present invention may be applied in various ways other than those shown in the embodiments. For example, while GaAs and AlGaAs are used as the material to form the light amplifier, other III-V group semiconductors or II-VI group semiconductors may be used to form the light amplifier. The present invention includes all such modifications without departing from the scope of claims.

What is claimed is:

1. A semiconductor light amplifier comprising:
   a substrate;
   a semiconductor activation layer formed on said substrate for propagating light;
   said activation layer amplifying light propagated through said activation layer and having a wavelength in a predetermined range when a current is applied thereto;
   an electrode for supplying the current to at least a portion of said activation layer; and
   means for imparting a loss to the light propagated through said activation layer which has a wavelength in a portion of said predetermined wavelength range,
   wherein said activation layer has a first channel type wave guide through which the light to be amplified is propagated, and said means for imparting the loss includes a second channel type wave guide formed in a portion of said activation layer and having no amplification function and a directional optical coupler for coupling the light propagated through said first channel type wave guide which has the wavelength in said portion of range to said second channel type wave guide.

2. A semiconductor light amplifier comprising:
   a substrate;
   a semiconductor activation layer formed on said substrate for propagating light;
   said activation layer amplifying light propagated through said activation layer and having a wavelength in a predetermined range when a current is applied thereto;
   an electrode for supplying the current to at least a portion of said activation layer; and
   means for imparting a loss to the light propagated through said activation layer which has a wavelength in a portion of said predetermined wavelength range,
   wherein said activation layer has a channel type wave guide through which the light to be amplified is propagated, and said means for imparting the loss includes a slab type wave guide formed externally of said channel type wave guide and having on amplification function and a grating for diffracting the light propagated through said channel type wave guide which has the wavelength in said portion of range to couple the light to said slab type wave guide.

3. A semiconductor light amplifier comprising:

a substrate;

a semiconductor activation layer formed on said substrate for propagating light;

said activation layer amplifying light propagated through said activation layer and having a wavelength in a predetermined range when a current is applied thereto;

an electrode for supplying the current to at least a portion of said activation layer; and means for imparting a loss to the light propagated through said activation layer which has a wavelength in a portion of said predetermined wavelength range, wherein said means for imparting the loss includes a light absorption region formed on a portion of said activation layer for absorbing the light having the wavelength in said portion of range.

4. A semiconductor light amplifier comprising:

a substrate;

a semiconductor activation layer formed on said substrate for propagating a light;

said activation layer amplifying a light propagated through said activation layer and having a wavelength within a predetermined range when a current is applied thereto;

said activation layer having a non-flat gain spectrum in said predetermined wavelength range;

an electrode for supplying a current to at least a portion of said activation layer; and means for imparting a loss to the light propagated through said activation layer which has a wavelength in a portion of said predetermined wavelength range;

said portion of wavelength range corresponding to a wavelength range having a relatively high gain in a gain spectrum of said activation layer;

said means flattening a gain spectrum of the light outputted from said activation layer for the light inputted to said activation layer, relative to the gain spectrum of said activation layer.

5. A semiconductor light amplifier according to claim 4 wherein said means for imparting the loss includes an optical wave guide layer laminated on said activation layer on said substrate and a grating coupler for coupling the light propagated through said activation layer which has the wavelength in said portion of the range.

6. A semiconductor light amplifier according to claim 4 wherein said activation layer has a first channel type wave guide through which the light to be amplified is propagated, and said means for imparting the loss includes a second channel type wave guide formed in a portion of said activation layer and having no amplification function and a directional optical coupler for coupling the light propagated through said first channel type wave guide which has the wavelength in said portion of range to said second channel type wave guide.

7. A semiconductor light amplifier according to claim 4 wherein said activation layer has a channel type wave guide through which the light to be amplified is propagated, and said means for imparting the loss includes a slab type wave guide formed externally of said channel type wave guide and having no amplification function and a grating for diffracting the light propagated through said channel type wave guide which has the wavelength in said portion of range to couple the light to said slab type wave guide.

8. A semiconductor light amplifier according to claim 4 wherein said means for imparting the loss includes a light absorption region formed on a portion of said activation layer for absorbing the light having the wavelength in said portion of range.

9. A method for amplifying a light by using a semiconductor light amplifier having a substrate, a semiconductor activation layer formed on said substrate, an electrode for supplying a current to at least a portion of said activation layer and means for imparting a loss to a portion of light propagated through said activation layer, comprising the steps of:

applying a light to said activation layer;

propagating the input light through said activation layer;

applying a current from said electrode to said activation layer to amplify a light propagated through said activation layer which has a wavelength within a predetermined range;

said activation layer having a non-flat gain spectrum in said predetermined wavelength range;

imparting a loss by said means for imparting the loss to the light propagated through said activation layer which has a wavelength in a portion of said predetermined wavelength range; and taking out the amplified light from said activation layer, said portion of wavelength range corresponding to a wavelength range having a relatively high gain in a gain spectrum of said activation layer, a gain spectrum of the light outputted from said activation layer for the light inputted to said activation layer being flattened relative to the gain spectrum of said activation layer by imparting the loss to the light in said portion of wavelength range.

10. A semiconductor light amplifier comprising:

a substrate;

a semiconductor activation layer formed on said substrate for propagating a light in a first propagation mode;

said activation layer amplifying a light propagated through said activation layer and having a wavelength within a predetermined range;

an electrode for supplying a current to at least a portion of said activation layer;

a wave guide layer formed on said substrate to be laminated on said activation layer thicknesswise;

said wave guide layer propagating the light in a second propagation mode different from said first propagation mode; and a diffraction grating formed in an overlapping area of said first propagation mode and said second propagation mode;

said diffraction grating coupling the light propagated through said activation layer which has a wavelength in a portion of said predetermined wavelength range, to said wave guide layer;

the light coupled to said wave guide layer being separated from the light amplified by said activation layer.

11. A semiconductor light amplifier according to claim 10 further comprising first, second and third clad layers;

said first clad layers, said activation layer, said second clad layer, said wave guide layer and said third clad layer being laminated on said substrate in this sequence.

12. A semiconductor light amplifier according to claim 11 wherein said diffraction grating is formed on a boundary surface between said second clad layer and said wave guide layer.

13. A semiconductor light amplifier according to claim 11 wherein said third clad layer and said wave guide layer have opposite ends along the direction of light propagation etched away.

14. A semiconductor light amplifier according to claim 11 wherein a portion of said first clad layer, said activation layer, said second clad layer, said wave guide layer and said third clad layer are mesa-etched except a stripe area extending along the direction of light propagation, and buried layers are formed on the opposite sides of the mesa.

15. A semiconductor light amplifier according to claim 14 wherein said activation layer and said wave guide layer have a multi-quantum well structure.

16. A semiconductor light amplifier according to claim 11 wherein said substrate and said layers are made of GaAs and AlGaAs, respectively.

17. A semiconductor light amplifier according to claim 10 wherein said wave guide layer is curved so that a distance from said activation layer is shorter at a center and longer at the opposite ends.

18. A semiconductor light amplifier according to claim 10 wherein $$\beta_1(\lambda) - \beta_2(\lambda) = 2\pi/\Lambda$$

is met, where $\lambda$ is a wavelength of said portion of range, $\beta_1(\lambda)$ is a propagation constant in said first propagation mode, $\beta_2(\lambda)$ is a propagation constant in said second propagation mode and $\Lambda$ is a pitch of said diffraction grating.

19. A semiconductor light amplifier according to claim 18 wherein:

$$L < \pi/2K$$

$$K = \int E_1 A_1(x) E_2 dx$$

is met, where $E_1$ is an electric field distribution in said first propagation mode, $E_2$ is an electric field distribution in said second propagation mode, $A_1(x)$ is a component of Fourier progression development of said diffraction grating corresponding to the primary diffracted light and L is the length of said diffraction grating.

20. A semiconductor light amplifier comprising:
a substrate made of an n-type semiconductor;
a first clad formed on said substrate and made of an n-type semiconductor;
an activation layer formed on said first clad layer and made of a non-doped semiconductor for propagating a light in a first propagation mode;
said activation layer amplifying a light propagated through said activation layer and having a wavelength within a predetermined range when a current is applied thereto;
a second clad layer formed on said activation layer and made of a p-type semiconductor;
a wave guide layer formed on said second clad layer and made of a p-type semiconductor;
said wave guide layer propagating a light in a second propagation mode different from said first propagation mode;
a third clad layer formed on said wave guide layer and made of a p-type semiconductor;
a p-type electrode formed on said third clad layer;
an n-type electrode formed on a bottom surface of said substrate; and
a diffraction grating formed in an overlapping area of said first propagation mode and said second propagation mode;
said diffraction grating coupling the light propagated through said activation layer which has a wavelength in a portion of said predetermined wavelength range to said wave guide layer;
the light coupled to said wave guide layer being separated from the light amplified by said activation layer.

21. A semiconductor light amplifier according to claim 20 wherein said diffraction grating is formed on a boundary surface between said second clad layer and said wave guide layer.

22. A semiconductor light amplifier according to claim 20 wherein said third clad layer and said wave guide layer have opposite ends along the direction of light propagation etched away.

23. A semiconductor light amplifier according to claim 20 wherein a portion of said first clad layer, said activation layer, said second clad layer, said wave guide layer and said third clad layer are mesa-etched except a stripe area extending along the direction of light propagation, and buried layers are formed on the opposite sides of the mesa.

24. A semiconductor light amplifier according to claim 20 wherein said activation layer and said wave guide layer have a multi-quantum well structure.

25. A semiconductor light amplifier according to claim 20 wherein said substrate and said layers are made of GaAs and AlGaAs, respectively.

26. A semiconductor light amplifier according to claim 20 wherein said wave guide layer is curved so that a distance from said activation layer is shorter at a center and longer at the opposite ends.

27. A semiconductor light amplifier according to claim 20 wherein $$\beta_1(\lambda) - \beta_2(\lambda) = 2\pi/\Lambda$$

is met, where $\lambda$ is a wavelength of said portion of range, $\beta_1(\lambda)$ is a propagation constant in said first propagation mode, $\beta_2(\lambda)$ is a propagation constant in said second propagation mode and $\Lambda$ is a pitch of said diffraction grating.

28. A semiconductor light amplifier according to claim 20 wherein:

$$L < \pi/2K$$

$$K = \int E_1 A_1(x) E_2 dx$$

is met, where $E_1$ is an electric field distribution in said first propagation mode, $E_2$ is an electric field distribution in said second propagation mode, $A_1(x)$ is a component of Fourier progression development of said diffraction grating corresponding to the primary diffracted light and L is the length of said diffraction grating.

29. A semiconductor light amplifier comprising:
a substrate;
a semiconductor activation layer formed on said substrate for propagation light;
said activation layer amplifying light propagated through said activation layer and having a wavelength in a predetermined range when a current is applied thereto;

an electrode for supplying the current to at least a portion of said activation layer;

means for imparting a loss to the light propagated through said activation layer which has a wavelength in a portion of said predetermined wavelength range; and a power supply connected to said electrode, wherein said activation layer has a first channel type wave guide through which the light to be amplified is propagated, and said means for imparting the loss includes a second channel type wave guide formed in a portion of said activation layer and having no amplification function and a directional optical coupler for coupling the light propagated through said first channel type wave guide which has the wavelength in said portion of range to said second channel type wave guide.

30. A semiconductor light amplifier comprising:

a substrate;

a semiconductor activation layer formed on said substrate for propagating light;

said activation layer amplifying light propagated through said activation layer and having a wavelength in a predetermined range when a current is applied thereto;

an electrode for supplying the current to at least a portion of said activation layer;

means for imparting a loss to the light propagated through said activation layer which has a wavelength in a portion of said predetermined wavelength range; and a power supply connected to said electrode, wherein said activation layer has a channel type wave guide through which the light to be amplified is propagated, and said means for imparting the loss includes a slab type wave guide formed externally of said channel type wave guide and having no amplification function and a grating for diffracting the light propagated through said channel type wave guide which has the wavelength in said portion of range to couple the light to said slab type wave guide.

31. A semiconductor light amplifier comprising:

a substrate;

a semiconductor activation layer formed on said substrate for propagating light;

said activation layer amplifying light propagated through said activation layer and having a wavelength in a predetermined range when a current is applied thereto;

an electrode for supplying the current to at least a portion of said activation layer;

means for imparting a loss to the light propagated through said activation layer which has a wavelength in a portion of said predetermined wavelength range; and a power supply connected to said electrode, wherein said means for imparting the loss said activation layer for absorbing the light having the wavelength in said portion of range.

32. A semiconductor light amplifier comprising:

(a) a plurality of terminals each including at least one of a light transmitter and a light receiver;

(b) a light transmission line for interconnecting said terminals; and (c) a light amplifier arranged in a path of said light transmission line for amplifying a light signal transmitted through said line, said light amplifier including;

a substrate;

a semiconductor activation layer formed on said substrate for propagating light;

said activation layer amplifying light propagated through said activation layer and having a wavelength in a predetermined range when a current is applied thereto;

an electrode for supplying the current to at least a portion of said activation layer; and means for imparting a loss to the light propagated through said activation layer which has a wavelength in a portion of said predetermined wavelength range, wherein said activation layer has a first channel type wave guide through which the light to be amplified is propagated, and said means for imparting the loss includes a second channel type wave guide formed in a portion of said activation layer and having no amplification function and a directional optical coupler for coupling the light propagated through said first channel type wave guide which has the wavelength in said portion of range to said second channel type wave guide.

33. A semiconductor light amplifier comprising:

(a) a plurality of terminals each including at least one of a light transmitter and a light receiver;

(b) a light transmission line for interconnecting said terminals; and (c) a light amplifier arranged in a path of said light transmission line for amplifying a light signal transmitted through said line, said light amplifier including;

a substrate;

a semiconductor activation layer formed on said substrate for propagation light;

said activation layer amplifying light propagated through said activation layer and having a wavelength in a predetermined range when a current is applied thereto;

an electrode for supplying the current to at least a portion of said activation layer;

means for imparting a loss to the light propagated through said activation layer which has a wavelength in a portion of said predetermined wavelength range, wherein said activation layer has a channel type wave guide through which the light to be amplified is propagated, and said means for imparting the loss includes a slab type wave guide formed externally of said channel type wave guide and having no amplification function and a grating for diffracting the light propagated through said channel type wave guide which has the wavelength in said portion of range to couple the light to said slab type wave guide.

34. A semiconductor light amplifier comprising:

(a) a plurality of terminals each including at least one of a light transmitter and a light receiver;

(b) a light transmission line for interconnecting said terminals; and (c) a light amplifier arranged in a path of said light transmission line for amplifying a light signal transmitted through said line, said light amplifier including;

a substrate;

a semiconductor activation layer formed on said substrate for propagating light;

said activation layer amplifying light propagated through said activation layer and having a wavelength in a predetermined range when a current is applied thereto;

an electrode for supplying a current to at least a portion of said activation layer; and means for imparting a loss to the light propagated through said activation layer which has a wavelength in a portion of said predetermined wavelength range, wherein said means for imparting the loss includes a light absorption region formed on a portion of said activation layer for absorbing the light having the wavelength in said portion of range.

35. A method of amplifying light by use of a semiconductor light amplifier comprising a substrate, a semiconductor active layer provided on the substrate for propagating light in a first propagation mode, said active layer amplifying light propagated therethrough and having a wavelength with a predetermined range when a current is supplied, an electrode for supplying the current to at least a portion of said active layer, a waveguide layer provided to be layered on said active layer on the substrate in a thickness direction, said waveguide layer propagating light in a second predetermined mode different form the first propagation mode and a diffraction grating provided on a region where the first and second propagation modes overlap each other, said method comprising the steps of:

inputting light to said active layer;

propagating the inputted light through said active layer;

coupling to said waveguide layer a part of the light having a wavelength within said predetermined wavelength range among the light propagated through said active layer by said diffraction grating;

supplying the current form said electrode to said active layer to amplify the light propagated through said active layer other than the light coupled to said waveguide layer; and extracting the amplified light from said active layer.

36. A light amplifier comprising:

a semiconductor active layer provided on the substrate for propagating light, said active layer amplifying the light propagated therethrough and having a wavelength within a predetermined wavelength range when a current is supplied thereto, said active layer having a non-flat gain spectrum in said predetermined wavelength range;

an electrode for supplying the current to at least a part of said active layer;

means for imparting a loss to light having a wavelength in a part of said predetermined wavelength range among the light propagated through said active layer, wherein said part of said wavelength range corresponds to a wavelength range having a relatively high gain in the gain spectrum of said active layer and said means causes a gain spectrum of amplification of the light outputted from said active layer to the light inputted to said active layer to be more flattened relative to the gain spectrum of said active layer; and a power source connected to said electrode.

37. A light amplifier according to claim 36, wherein said loss imparting means comprises an optical waveguide layer provided to be layered on said active layer on the substrate and a grating coupler for coupling the light having the wavelength in said part of said wavelength range among the light propagated through said active layer to said optical waveguide layer.

38. A method of amplifying light by use of a light amplifier comprising a substrate, a semiconductor active layer provided on the substrate, an electrode for supplying a current to at least a part of the active layer, means for imparting a loss to a part of light propagated through the active layer and a power source connected to the electrode, said method comprising the steps of:

inputting light to said active layer;

propagating the inputted light through said active layer;

supplying the current from said electrode to said active layer to amplify the light propagated through said active layer and having a wavelength within a predetermined range, wherein said active layer has a non-flat gain spectrum in said predetermined wavelength range;

imparting a loss to light having a wavelength in a part of said predetermined wavelength range among the light propagated through said active layer by said loss imparting means; and extracting the amplified light from said active layer, wherein said part of said wavelength range corresponds to a wavelength range having a relatively high gain in the gain spectrum of said active layer, and the gain spectrum of amplification of light outputted from said active layer to the inputted light into said active layer is caused to be more flattened relatively to the gain spectrum of said active layer by imparting the loss to the light having the wavelength in said part of said wavelength range.

39. An optical communication system comprising:

(a) a plurality of terminals each of which includes at least one of an optical transmitter and an optical receiver;

(b) an optical transmission line for interconnecting said plurality of terminals; and (c) a light amplifier, arranged in a path of said optical transmission line, for amplifying a light signal transmitted through said transmission line, said light amplifier comprising:

a substrate;

a semiconductor active layer provided on said substrate for propagating light, said active layer amplifying the light propagated therethrough and having a wavelength within a predetermined wavelength range when a current is supplied thereto, said active layer having a non-flat gain spectrum in said predetermined wavelength range;

an electrode for supplying a current to at least a part of said active layer; and means for imparting a loss to light having a wavelength in part of said predetermined wavelength range among the light propagated through said active layer, wherein said part of said wavelength range corresponds to a wavelength range having a relatively high gain in the gain spectrum of said active layer, and said loss imparting means causes the gain spectrum of amplification of light outputted from said active layer to the inputted light into said active layer to be more flattened relatively to the gain spectrum of said active layer.

40. A system according to claim 39, wherein said loss imparting means comprises an optical waveguide layer provided to be layered on said active layer on the substrate and a grating coupler for coupling the light having the wavelength in said part of wavelength range among the light propagated through said active layer to said optical waveguide layer.

41. A semiconductor light amplifier comprising:
a substrate;
a semiconductor active layer provided on said substrate for propagating light, said active layer amplifying a plurality of light rays propagated therethrough and having different wavelengths within a predetermined wavelength range when a current is supplied thereto, said active layer having a non-flat fain spectrum in said predetermined wavelength range;
an electrode for supplying the current to at least a part of said active layer; and
means for imparting a loss to a light ray having a wavelength in a part of said predetermined wavelength range among the light rays propagated through said active layer, wherein said part of said wavelength range corresponds to a wavelength range having a relatively high gain in the gain spectrum of said active layer and said loss imparting means causes gains for said plurality of light rays to be substantially uniform.

42. A semiconductor light amplifier according to claim 41, wherein said loss imparting means comprises an optical waveguide layer provided to be layered on said active layer on the substrate and a grating coupler for coupling the light ray having the wavelength in said part of said wavelength range among the light rays propagated through said active layer to said optical waveguide layer.

43. A method of amplifying light by use of a semiconductor light amplifier comprising a substrate, a semiconductor active layer provided on the substrate, an electrode for supplying a current to at least a part of the active layer and means for imparting a loss to a part of the light propagated through the active layer, said method comprising the steps of:
inputting light into said active layer;
propagating the inputted light through said active layer;
supplying the current to said active layer from said electrode to amplify a plurality of light rays propagated through said active layer and having different wavelengths within a predetermined wavelength range, wherein said active layer has a non-flat gain spectrum in said predetermined wavelength range;
imparting a loss to a light ray having a wavelength in a part of said predetermined wavelength range among the light rays propagated through said active layer by said loss imparting means; and
extracting the amplified light rays from said active layer,
wherein said part of said wavelength range corresponds to a wavelength range having a relatively high gain in the gain spectrum of said active layer, and gains for said plurality of light rays are caused to be substantially uniform by imparting the loss to the light rays having the wavelength in said part of said wavelength range.

44. A light amplifier comprising:
a substrate;
a semiconductor active layer provided on said substrate for propagating light, said active layer amplifying a plurality of light rays propagated therethrough and having different wavelengths from one another within a predetermined wavelength range when a current is supplied thereto, said active layer having a non-flat gain spectrum in said predetermined wavelength range;
an electrode for supplying the current to at least a part of said active layer;
means for imparting a loss to light having a wavelength in a part of said predetermined wavelength range among the light propagated through said active layer, wherein said part of said wavelength range corresponds to a wavelength range having a relatively high gain in the gain spectrum of said active layer and said loss imparting means causes gains for said plurality of lights to be substantially uniform; and
a power source connected to said electrode.

45. A light amplifier according to claim 44, wherein said loss imparting means comprises an optical waveguide layer provided to be layered on said active layer on the substrate and a grating coupler for coupling the light ray having the wavelength in said part of wavelength range among the light propagated through said active layer, to said optical wavelength layer.

46. A method of amplifying light by use of a light amplifier comprising a substrate, a semiconductor active layer provided on the substrate, an electrode for supplying a current to at least a part of said active layer, means for imparting a loss to a part of the light propagated through the active layer and a power source connected to said electrode, said method comprising the steps of:
inputting light to said active layer;
propagating the inputted light through said active layer;
supplying a current to said active layer from said electrode to amplify a plurality of light rays propagated through said active layer and having different wavelengths from one another within a predetermined wavelength range, wherein said active layer having a non-flat gain spectrum in said predetermined wavelength range;
imparting a loss to a light ray having a wavelength in a part of said predetermined wavelength range among the light rays propagated through said active layer by said loss imparting means; and
extracting the amplified light rays from said active layer;
wherein said part of said wavelength range corresponds to a wavelength range having a relatively high gain in the gain spectrum of said active layer, and gains for said plurality of light rays are caused to be substantially uniform by imparting the loss to the light ray having the wavelength in said part of wavelength range.

47. An optical communication system comprising:
(a) a plurality of terminals each of which has at least one of an optical transmitter and an optical receiver;
(b) an optical transmission line for interconnecting said plurality of terminals; and
(c) a light amplifier arranged in a path of said transmission line for amplifying an optical signal transmitted through said transmission line, said light amplifier comprising:

a substrate;

a semiconductor active layer provided on the substrate for propagating light, said active layer amplifying a plurality of light rays propagated therethrough and having different wavelengths from one another within a predetermined wavelength range when a current is supplied thereto, said active layer having a non-flat gain spectrum in said predetermined wavelength range;

an electrode for supplying a current to at least a part of said active layer; and means for imparting a loss to a light ray having a wavelength in a part of said predetermined wavelength range among the light rays propagated through said active layer, wherein said part of said wavelength range corresponds to a wavelength range having a relatively high gain in the gain spectrum of said active layer, and said loss imparting means causes gains for said plurality of light rays to be substantially uniform.

48. A system according to claim 47, wherein said loss imparting means comprises an optical waveguide layer provided to be layered on said active layer on the substrate and a grating coupler for coupling the light ray having the wavelength in said part of said wavelength range among the light rays propagated through said active layer to said optical waveguide layer.

* * * * *

UNITED STATES PATENT AND TRADEMARK OFFICE
CERTIFICATE OF CORRECTION

PATENT NO. : 5,239,410

DATED : August 24, 1993

INVENTOR(S) : MICHIYO NISHIMURA, ET AL.　　　　Page 1 of 3

It is certified that error appears in the above-identified patent and that said Letters Patent is hereby corrected as shown below:

ON TITLE PAGE

In [56] References Cited, under FOREIGN PATENT DOCUMENTS, insert:

-- 　1-170084　　5/1989　Japan .
　　64-17526　　1/1989　Japan .
　　62-279733　 4/1987　Japan .
　　3631971　　 3/1987　Fed. Rep. of Germany .
　　0189273　　 7/1986　European Pat. Off. .
　　0386797　　 9/1990　European Pat. Off. . --.

In [56] References Cited, insert:

-- 　OTHER PUBLICATIONS

Xerox Disclosure Journal, Vol. 4, No. 3, pages 361-362, Galeener, F.L., et al.: "Integrated Waveguide Coupler."
Applied Physics Letters, Vol. 55, No. 19, pages 2011-2013, 6 November 1989, Alferness, R.C., et al.: "Grating-assisted InGaAsP/InP Vertical Codirectional Coupler Filter."
IEEE Journal of Quantum Electronics, Vol. 23, No. 6, pages 889-897, June 1987, Koch, T.L., et al.: "Vertically Grating-Coupled ARROW Structures for III-V Integrated Optics." --.

COLUMN 2

Line 10, "#to" should read --to--.

UNITED STATES PATENT AND TRADEMARK OFFICE
CERTIFICATE OF CORRECTION

PATENT NO. : 5,239,410
DATED : August 24, 1993
INVENTOR(S) : MICHIYO NISHIMURA, ET AL.

Page 2 of 3

It is certified that error appears in the above-identified patent and that said Letters Patent is hereby corrected as shown below:

COLUMN 5

Line 8, "Al0.4Ga$_{0.6}$As" should read --Al$_{0.4}$Ga$_{0.6}$As--.
Line 9, "MC-CVD" should read --MO-CVD--.
Line 27, "MC CVD" should read --MO-VCD--.

COLUMN 6

Line 11, "Λ]is" should read --Λ is--.

COLUMN 7

Line 35, "of" should be deleted.
Line 36, "the gain" should be deleted.

COLUMN 10

Line 62, "on" should read --no--.

COLUMN 12

Line 63, "layers," should read --layer--.

COLUMN 13

Line 15, "claim 14" should read --claim 11--.
Line 50, "clad" should read --clad layer--.

COLUMN 17

Line 29, "form" should read --from--.
Line 41, "form" should read --from--.

UNITED STATES PATENT AND TRADEMARK OFFICE
CERTIFICATE OF CORRECTION

PATENT NO. : 5,239,410
DATED : August 24, 1993
INVENTOR(S) : MICHIYO NISHIMURA, ET AL.

It is certified that error appears in the above-identified patent and that said Letters Patent is hereby corrected as shown below:

COLUMN 17

Line 46, "comprising," should read --comprising: ¶ a substrate;--.

COLUMN 19

Line 18, "fain" should read --gain--.

COLUMN 20

Line 29, "wavelength" should read --wave guide--.
Line 46, "having" should read --has--.
Line 60, "wavelength" should read --said wavelength--.

Signed and Sealed this

Fourteenth Day of June, 1994

BRUCE LEHMAN

Attest:

Attesting Officer

Commissioner of Patents and Trademarks